United States Patent [19]

Konno

[11] Patent Number: 5,304,997
[45] Date of Patent: Apr. 19, 1994

[54] 8-BIT DATA WORD TO 15-BIT CODEWORD CONVERTER UTILIZING PERIODICALLY VARYING DIGITAL SUM VARIATION

[75] Inventor: Ichirou Konno, Chiba, Japan

[73] Assignee: Sharp Kabushiki Kaisha, Osaka, Japan

[21] Appl. No.: 856,984

[22] Filed: Mar. 24, 1992

[30] Foreign Application Priority Data

Mar. 29, 1991 [JP] Japan .................................. 3-066963

[51] Int. Cl.⁵ .......................................... H03M 7/00
[52] U.S. Cl. .......................................... 341/95; 341/58
[58] Field of Search ............ 341/95, 58, 59, 55, 341/106, 68, 69; 375/19; 360/41

[56] References Cited

U.S. PATENT DOCUMENTS

| | | | |
|---|---|---|---|
| 4,646,281 | 2/1987 | Verboom | 369/59 |
| 4,766,573 | 8/1988 | Takemae | 365/222 |
| 4,833,470 | 5/1989 | Iketani | 341/59 |
| 5,016,258 | 5/1991 | Tanaka et al. | 375/25 |

FOREIGN PATENT DOCUMENTS

0104700 9/1983 European Pat. Off. .
0319101 11/1988 European Pat. Off. .
0339724 4/1989 European Pat. Off. .
61-30818 2/1986 Japan .
1-220213 9/1989 Japan .

OTHER PUBLICATIONS

"An Experiment Digital VCR with 40MM Drum, Single Actuator & DCT-Based Bit-Rate Reduction" @ 1988 IEEE.

"A Study on the Servo Method for Home Use Digital VTR" vol. 14, No. 41, pp. 1-6 VIR. 90-43, Aug. 1990.

*Primary Examiner*—Brian K. Young

[57] ABSTRACT

A plurality of first codeword pairs each including a 15-bit codeword of which CDS is equal to +3 and a 15-bit codeword of which CDS is equal to −1 and a plurality of second code pairs each including a 15-bit codeword of which CDS is equal to +1 and a 15-bit codeword of which CDS is equal to −3 are produced. One of the plurality of first code pairs and one of the plurality of second code pairs are assigned to each 8-bit data word, and one of the first and second code pairs assigned to each 8-bit data word is selected so that the number of continuous identical bits in a 15-bit codeword sequence is not less than 2 and not more than 8. One of two 15-bit codewords included in the selected code pair is selected so that DSV at the last bit of each 15-bit codeword periodically varies.

17 Claims, 23 Drawing Sheets

FIG. 1

| FIRST 2 BITS | CDS | NUMBER OF CORRESPONDING CODEWORDS |
|---|---|---|
| 00 | +3<br>+1<br>-1<br>-3 | 5<br>9<br>120<br>115 |
| 01 | +3<br>+1<br>-1<br>-3 | 65<br>79<br>71<br>47 |
| 10 | +3<br>+1<br>-1<br>-3 | 47<br>71<br>79<br>65 |
| 11 | +3<br>+1<br>-1<br>-3 | 115<br>120<br>9<br>5 |

FIG. 2

| FIRST 2 BITS | CODE PAIR | NUMBER | 8-BIT DATA WORDS TO BE CORRESPONDED | USED NUMBER |
|---|---|---|---|---|
| 00 | +3, −1<br>+1, −3 | 54<br>95 | 0 ~ 52<br>53 ~ 146 | 53<br>94 |
| 01 | +3, −1<br>+1, −3 | 65<br>47 | 147 ~ 210<br>211 ~ 255 | 64<br>45 |
| 10 | +3, −1<br>+1, −3 | 47<br>65 | 211 ~ 255<br>147 ~ 210 | 45<br>64 |
| 11 | +3, −1<br>+1, −3 | 95<br>54 | 53 ~ 146<br>0 ~ 52 | 94<br>53 |

FIG. 3A

| 8-BIT DATA WORD (HEX) | CODEWORD | CDS | CODEWORD | CDS | CODEWORD | CDS | CODEWORD | CDS |
|---|---|---|---|---|---|---|---|---|
| 00 | 0000110011111111 | +3 | 0000000111111110 | -1 | 1100000001111111 | +1 | 1100000000011110 | -3 |
| 01 | 0000111001111111 | +3 | 0000001100111111 | -1 | 1100000111111110 | +1 | 1100000000110011 | -3 |
| 02 | 0000111100111111 | +3 | 0000001110011111 | -1 | 1100000011001111 | +1 | 1100000000111001 | -3 |
| 03 | 0000111110011111 | +3 | 0000001111001111 | -1 | 1100000111001111 | +1 | 1100000000111100 | -3 |
| 04 | 0000111111001111 | +3 | 0000001111100111 | -1 | 1100000111100111 | +1 | 1100000001100011 | -3 |
| 05 | 0000111111100111 | +3 | 0000001111110011 | -1 | 1100000111110011 | +1 | 1100000001100110 | -3 |
| 06 | 0000111111110011 | +3 | 0000001111111001 | -1 | 1100000111111001 | +1 | 1100000001110001 | -3 |
| 07 | 0000110001111111 | +3 | 0000001100011111 | -1 | 1100000100011111 | +1 | 1100000011000011 | -3 |
| 08 | 0000110011001111 | +3 | 0000001100111110 | -1 | 1100000100111110 | +1 | 1100000011000110 | -3 |
| 09 | 0000111001100111 | +3 | 0000001110011100 | -1 | 1100000111001110 | +1 | 1100000011000111 | -3 |
| 0A | 0000111100110011 | +3 | 0000001111001110 | -1 | 1100000111100110 | +1 | 1100000011001100 | -3 |
| 0B | 0000111100011111 | +3 | 0000001111100011 | -1 | 1100000111100011 | +1 | 1100000011100001 | -3 |
| 0C | 0000111110011001 | +3 | 0000001111110001 | -1 | 1100000111110001 | +1 | 1100000011110000 | -3 |
| 0D | 0000111110001111 | +3 | 0000001111100011 | -1 | 1100000100001111 | +1 | 1100000100000011 | -3 |
| 0E | 0000111110011110 | +3 | 0000001111100110 | -1 | 1100000111100010 | +1 | 1100000100000110 | -3 |
| 0F | 0000111111000111 | +3 | 0000001111110001 | -1 | 1100000110001111 | +1 | 1100000110001100 | -3 |

FIG. 3B

| 8-BIT DATA WORD (HEX) | CODEWORD | CDS | CODEWORD | CDS | CODEWORD | CDS | CODEWORD | CDS |
|---|---|---|---|---|---|---|---|---|
| 10 | 0001111111001110 | +3 | 0000011111111000 | -1 | 1100011000011110 | +1 | 1100000110011000 | -3 |
| 11 | 0001111111100011 | +3 | 0000011000011111 | -1 | 1100011001110011 | +1 | 1100001111000001 | -3 |
| 12 | 0001111111100110 | +3 | 0000011001100111 | -1 | 1100011001110011 | +1 | 1100001111100000 | -3 |
| 13 | 0001111111110001 | +3 | 0000011001100111 | -1 | 1100011001111100 | +1 | 1100011100000011 | -3 |
| 14 | 0011000011111111 | +3 | 0000011001111001 | -1 | 1100011110000111 | +1 | 1100011000000110 | -3 |
| 15 | 0011000111111110 | +3 | 0000011001111001 | -1 | 1100011110001110 | +1 | 1100011100001100 | -3 |
| 16 | 0011001100111111 | +3 | 0000011001111100 | -1 | 1100011110011001 | +1 | 1100011001011000 | -3 |
| 17 | 0011001111001111 | +3 | 0000011100001111 | -1 | 1100011110011001 | +1 | 1100011100110000 | -3 |
| 18 | 0011001111100111 | +3 | 0000011100011110 | -1 | 1100011110011100 | +1 | 1100011110000001 | -3 |
| 19 | 0011001111110011 | +3 | 0000011100110011 | -1 | 1100011111000011 | +1 | 1100011111000000 | -3 |
| 1A | 0011001111111001 | +3 | 0000011100111001 | -1 | 1100011111000110 | +1 | 1100111000000011 | -3 |
| 1B | 0011001111111100 | +3 | 0000011100111100 | -1 | 1100011111001100 | +1 | 1100011000000110 | -3 |
| 1C | 0011100001111111 | +3 | 0000011110000111 | -1 | 1100011111110000 | +1 | 1100011000001100 | -3 |
| 1D | 0011100011111111 | +3 | 0000011110001110 | -1 | 1100011000001111 | +1 | 1100011000011000 | -3 |
| 1E | 0011100110011111 | +3 | 0000011110011001 | -1 | 1100011000011110 | +1 | 1100011000110000 | -3 |
| 1F | 0011100111001111 | +3 | 0000011110011100 | -1 | 1100011000110011 | +1 | 1100011001100000 | -3 |

FIG. 4A

| 8-BIT DATA WORD (HEX) | CODEWORD | CDS | CODEWORD | CDS | CODEWORD | CDS | CODEWORD | CDS |
|---|---|---|---|---|---|---|---|---|
| 20 | 0011100111110011 | +3 | 0000111111000011 | -1 | 1100110001111001 | +1 | 1100110000000001 | -3 |
| 21 | 0011100111111001 | +3 | 0000111111000110 | -1 | 1100110001111100 | +1 | 1100111110000000 | -3 |
| 22 | 0011100111111100 | +3 | 0000111111001100 | -1 | 1100110011100011 | +1 | 1110000000001110 | -3 |
| 23 | 0011100111000111 | +3 | 0000111111100001 | -1 | 1100110011100110 | +1 | 1110000000011001 | -3 |
| 24 | 0011100111000111 | +3 | 0000111111110000 | -1 | 1100110011100001 | +1 | 1110000000011100 | -3 |
| 25 | 0011100110100111 | +3 | 0001100000011111 | -1 | 1100110011111000 | +1 | 1110000000110001 | -3 |
| 26 | 0011100110110011 | +3 | 0001100001100111 | -1 | 1100110001000111 | +1 | 1110000001100001 | -3 |
| 27 | 0011100110111001 | +3 | 0001100011000111 | -1 | 1100110011001001 | +1 | 1110000001110000 | -3 |
| 28 | 0011100110111100 | +3 | 0001100011001110 | -1 | 1100110011001100 | +1 | 1110000011000001 | -3 |
| 29 | 0011100111000111 | +3 | 0001100011111001 | -1 | 1100110011001110 | +1 | 1110000011100000 | -3 |
| 2A | 0011100111001110 | +3 | 0001100011111100 | -1 | 1100110011000110 | +1 | 1110000110000001 | -3 |
| 2B | 0011100110011001 | +3 | 0001100111100111 | -1 | 1100110011001110 | +1 | 1110001100000001 | -3 |
| 2C | 0011100111001001 | +3 | 0001100110011110 | -1 | 1100110011100000 | +1 | 1110001110000000 | -3 |
| 2D | 0011100111001100 | +3 | 0001100111000011 | -1 | 1100111110000110 | +1 | 1110011000000001 | -3 |
| 2E | 0011100111100011 | +3 | 0001100111100110 | -1 | 1100110111001100 | +1 | 1110011000000000 | -3 |
| 2F | 0011110000001110 | +3 | 0001110011110001 | -1 | 1100111110011000 | +1 | 1110000000000110 | -3 |

FIG. 4B

| 8-BIT DATA WORD (HEX) | CODEWORD | CDS | CODEWORD | CDS | CODEWORD | CDS | CODEWORD | CDS |
|---|---|---|---|---|---|---|---|---|
| 30 | 0011111001101001 | +3 | 0001100111111000 | -1 | 1100111110000001 | +1 | 1110000000001100 | -3 |
| 31 | 0011111001101100 | +3 | 0001110000001111 | -1 | 1100111111100000 | +1 | 1110000000011000 | -3 |
| 32 | 0011111111000011 | +3 | 0001110000011110 | -1 | 1110000000011111 | +1 | 1110000000110000 | -3 |
| 33 | 0011111111000110 | +3 | 0001110001100011 | -1 | 1110000000111110 | +1 | 1110000001100000 | -3 |
| 34 | 0011111111001100 | +3 | 0001110001110001 | -1 | 1110000001100111 | +1 | 1110000110000000 | -3 |
| 35 | 0000001111111110 | +1 | 0000000111001111 | -3 | 1110000001111111 | +3 | 1100000000011111 | -1 |
| 36 | 0000011001111111 | +1 | 0000000111100111 | -3 | 1110000011001111 | +3 | 1100000000111110 | -1 |
| 37 | 0000011100111111 | +1 | 0000000111110011 | -3 | 1110000011100111 | +3 | 1100000001100111 | -1 |
| 38 | 0000011110011111 | +1 | 0000000111111001 | -3 | 1110000011111001 | +3 | 1100000001110011 | -1 |
| 39 | 0000011111001111 | +1 | 0000000111111100 | -3 | 1110000111111100 | +3 | 1100000001111001 | -1 |
| 3A | 0000011111100111 | +1 | 0000001100111110 | -3 | 1100001100111111 | +3 | 1100000011000111 | -1 |
| 3B | 0000011111111001 | +1 | 0000001110011110 | -3 | 1100001110011111 | +3 | 1100000011001110 | -1 |
| 3C | 0000011111111100 | +1 | 0000001110011100 | -3 | 1100001110011110 | +3 | 1100000011001110 | -1 |
| 3D | 0000011000111111 | +1 | 0000001111000110 | -3 | 1100011001100111 | +3 | 1100000011100011 | -1 |
| 3E | 0000011001111110 | +1 | 0000001111000111 | -3 | 1100011001111110 | +3 | 1100000011100110 | -1 |
| 3F | 0000011100011111 | +1 | 0000001111100110 | -3 | 1100011100011111 | +3 | 1100000011110001 | -1 |

FIG. 5A

| 8-BIT DATA WORD (HEX) | CODEWORD | CDS | CODEWORD | CDS | CODEWORD | CDS | CODEWORD | CDS |
|---|---|---|---|---|---|---|---|---|
| 40 | 0000111001111110 | +1 | 0000001111110001 | −3 | 1100011100111110 | +3 | 1100000111111000 | −1 |
| 41 | 0000111100011111 | +1 | 0000001111111000 | −3 | 1100011110001111 | +3 | 1100000110000111 | −1 |
| 42 | 0000111110001110 | +1 | 0000001100001111 | −3 | 1100011111001110 | +3 | 1100000110001110 | −1 |
| 43 | 0000111111000111 | +1 | 0000001100011110 | −3 | 1100011111100011 | +3 | 1100000110011001 | −1 |
| 44 | 0000111111100011 | +1 | 0000001100110011 | −3 | 1100011111110001 | +3 | 1100000110011100 | −1 |
| 45 | 0000111111110001 | +1 | 0000001100111001 | −3 | 1100011111111000 | +3 | 1100000111000011 | −1 |
| 46 | 0000111111100110 | +1 | 0000001100111100 | −3 | 1100011001111111 | +3 | 1100000111000110 | −1 |
| 47 | 0000111111110001 | +1 | 0000001100000111 | −3 | 1100011000111111 | +3 | 1100000111001100 | −1 |
| 48 | 0000111111111000 | +1 | 0000001110000111 | −3 | 1100011000011111 | +3 | 1100000111110000 | −1 |
| 49 | 0000110000111111 | +1 | 0000001110001100 | −3 | 1100011001100111 | +3 | 1100001111000111 | −1 |
| 4A | 0000110001111110 | +1 | 0000001110011001 | −3 | 1100011001110011 | +3 | 1100001100001110 | −1 |
| 4B | 0000110011001111 | +1 | 0000001111000011 | −3 | 1100011001111001 | +3 | 1100001100011001 | −1 |
| 4C | 0000110011100111 | +1 | 0000001111000110 | −3 | 1100011001111100 | +3 | 1100001100011100 | −1 |
| 4D | 0000110011110011 | +1 | 0000001111001100 | −3 | 1100011100000111 | +3 | 1100001100011100 | −1 |
| 4E | 0000110011111001 | +1 | 0000001111100001 | −3 | 1100011100011001 | +3 | 1100001100110001 | −1 |
| 4F | 0000110011111100 | +1 | 0000001111110000 | −3 | 1100011100110011 | +3 | 1100001100111000 | −1 |

FIG. 5B

| 8-BIT DATA WORD (HEX) | CODEWORD | CDS | CODEWORD | CDS | CODEWORD | CDS | CODEWORD | CDS |
|---|---|---|---|---|---|---|---|---|
| 50 | 0001110000111111 | +1 | 0000110000001111 | -3 | 1100111001011001 | +3 | 1100011100000011 | -1 |
| 51 | 0001110001111110 | +1 | 0000110000011110 | -3 | 1100110011011100 | +3 | 1100011100000110 | -1 |
| 52 | 0001110011100111 | +1 | 0000110001100011 | -3 | 1100111000000111 | +3 | 1100011100001100 | -1 |
| 53 | 0001110011100011 | +1 | 0000110001110001 | -3 | 1100111000011110 | +3 | 1100011100011000 | -1 |
| 54 | 0001110011110001 | +1 | 0000110001111100 | -3 | 1100111100011001 | +3 | 1100011110000001 | -1 |
| 55 | 0001110011111100 | +1 | 0000110011000011 | -3 | 1100111110011100 | +3 | 1100011111100000 | -1 |
| 56 | 0001110011110011 | +1 | 0000110011001100 | -3 | 1100111111000011 | +3 | 1100011110000111 | -1 |
| 57 | 0001110000111111 | +1 | 0000110011100110 | -3 | 1100111111000110 | +3 | 1100011100000110 | -1 |
| 58 | 0001111000110011 | +1 | 0000110011111000 | -3 | 1100111111001100 | +3 | 1100011000011001 | -1 |
| 59 | 0001111001110001 | +1 | 0000111100000111 | -3 | 1100111111111000 | +3 | 1100011000011100 | -1 |
| 5A | 0001111001111100 | +1 | 0000111100001110 | -3 | 1100111111110000 | +3 | 1100011000110001 | -1 |
| 5B | 0001111110000011 | +1 | 0000111100011001 | -3 | 1110000011111111 | +3 | 1100011000111000 | -1 |
| 5C | 0001111110001110 | +1 | 0000111100011100 | -3 | 1110000111111110 | +3 | 1100011001100001 | -1 |
| 5D | 0001111100110001 | +1 | 0000111100110001 | -3 | 1110000110011111 | +3 | 1100011001100111 | -1 |
| 5E | 0001111100111100 | +1 | 0000111100111000 | -3 | 1110000111100111 | +3 | 1100011000000011 | -1 |
| 5F | 0001111110000011 | +1 | 0000111110000011 | -3 | 1110000111100011 | +3 | 1100011100000110 | -1 |

FIG. 6A

| 8-BIT DATA WORD (HEX) | CODEWORD | CDS | CODEWORD | CDS | CODEWORD | CDS | CODEWORD | CDS |
|---|---|---|---|---|---|---|---|---|
| 60 | 000111110000110 | +1 | 000011100000110 | −3 | 111000011111001 | +3 | 110011100001100 | −1 |
| 61 | 000111111001100 | +1 | 000011110001100 | −3 | 111000011111100 | +3 | 110011100011000 | −1 |
| 62 | 000111111100001 | +1 | 000011110011000 | −3 | 111000110001111 | +3 | 110011100110000 | −1 |
| 63 | 000111111110000 | +1 | 000011111000001 | −3 | 111000110011110 | +3 | 110011110000001 | −1 |
| 64 | 001000000111111 | +1 | 000011111100000 | −3 | 111000111001110 | +3 | 110011111000000 | −1 |
| 65 | 001000001111110 | +1 | 000110000001111 | −3 | 111000111100011 | +3 | 111000000001111 | −1 |
| 66 | 001000011001111 | +1 | 000110000011110 | −3 | 111000111100110 | +3 | 111000000011110 | −1 |
| 67 | 001000011100111 | +1 | 000110000110011 | −3 | 111000111110001 | +3 | 111000000110011 | −1 |
| 68 | 001000011110011 | +1 | 000110000111001 | −3 | 111000111111000 | +3 | 111000000111001 | −1 |
| 69 | 001000011111001 | +1 | 000110001001111 | −3 | 111001100001111 | +3 | 111000001100011 | −1 |
| 6A | 001000111111100 | +1 | 000110001100011 | −3 | 111001100011110 | +3 | 111000001100110 | −1 |
| 6B | 001001100001111 | +1 | 000110001100110 | −3 | 111001100110011 | +3 | 111000001110010 | −1 |
| 6C | 001001100011110 | +1 | 000110001110001 | −3 | 111001100111001 | +3 | 111000001110001 | −1 |
| 6D | 001001100110011 | +1 | 000110001111000 | −3 | 111001100111100 | +3 | 111000011111000 | −1 |
| 6E | 001001100111001 | +1 | 000110011000011 | −3 | 111001100110011 | +3 | 111000011000011 | −1 |
| 6F | 001001111000011 | +1 | 000110011000110 | −3 | 111001110000111 | +3 | 111000011000110 | −1 |

FIG. 6B

| 8-BIT DATA WORD (HEX) | CODEWORD | CDS | CODEWORD | CDS | CODEWORD | CDS | CODEWORD | CDS |
|---|---|---|---|---|---|---|---|---|
| 70 | 0011001111100110 | +1 | 0001100110011100 | −3 | 1110011100011110 | +3 | 1110000110011100 | −1 |
| 71 | 0011001111110001 | +1 | 0001100111100001 | −3 | 1110011100011001 | +3 | 1110000111100001 | −1 |
| 72 | 0011001111111000 | +1 | 0001100111110000 | −3 | 1110011100011100 | +3 | 1110000111110000 | −1 |
| 73 | 0011100000111111 | +1 | 0001110000000111 | −3 | 1110011111000011 | +3 | 1110001100000011 | −1 |
| 74 | 0011100001111110 | +1 | 0001110000001110 | −3 | 1110011111000110 | +3 | 1110001100000110 | −1 |
| 75 | 0011100011001111 | +1 | 0001110000011001 | −3 | 1110011111001100 | +3 | 1110001100001100 | −1 |
| 76 | 0011100011100111 | +1 | 0001110000011100 | −3 | 1110011111100001 | +3 | 1110001100011000 | −1 |
| 77 | 0011100011110011 | +1 | 0001110000110001 | −3 | 1110011111110000 | +3 | 1110001110000001 | −1 |
| 78 | 0011100011111100 | +1 | 0001110000111000 | −3 | 1110000000111111 | +3 | 1110001110000010 | −1 |
| 79 | 0011100110001111 | +1 | 0001110001100001 | −3 | 1110000001111110 | +3 | 1110001110000110 | −1 |
| 7A | 0011100111001100 | +1 | 0001110011000011 | −3 | 1110000011001111 | +3 | 1110001100001100 | −1 |
| 7B | 0011100111000111 | +1 | 0001110011000011 | −3 | 1110000110011110 | +3 | 1110001110001100 | −1 |
| 7C | 0011100111100011 | +1 | 0001110011000110 | −3 | 1110000111100011 | +3 | 1110001110011000 | −1 |
| 7D | 0011100111110001 | +1 | 0001110011001100 | −3 | 1110000111110010 | +3 | 1110001110010000 | −1 |
| 7E | 0011100111111000 | +1 | 0001110011110000 | −3 | 1110001110001110 | +3 | 1110001110000001 | −1 |
| 7F | 0011111000001111 | +1 | 0001111001100000 | −3 | 1110001100110100 | +3 | 1110001110000000 | −1 |

FIG. 7A

| 8-BIT DATA WORD (HEX) | CODEWORD | CDS | CODEWORD | CDS | CODEWORD | CDS | CODEWORD | CDS |
|---|---|---|---|---|---|---|---|---|
| 80 | 0011100011110 | +1 | 0001111100000001 | -3 | 1110001110011 | +3 | 1110000000111 | -1 |
| 81 | 0011100110011 | +1 | 0001111110000000 | -3 | 1110001110110 | +3 | 1110000001110 | -1 |
| 82 | 0011100111001 | +1 | 0011000000001111 | -3 | 1110001110001 | +3 | 1110000011001 | -1 |
| 83 | 0011100111100 | +1 | 0011000000011110 | -3 | 1110001111000 | +3 | 1110000011100 | -1 |
| 84 | 0011100110001 | +1 | 0011000000110011 | -3 | 1110001111111 | +3 | 1110000110001 | -1 |
| 85 | 0011100100110 | +1 | 0011000000111001 | -3 | 1110011000110 | +3 | 1110000110001 | -1 |
| 86 | 0011100110001 | +1 | 0011000001111100 | -3 | 1110011001001 | +3 | 1110000110000 | -1 |
| 87 | 0011100111000 | +1 | 0011000001100011 | -3 | 1110011001100 | +3 | 1110001110000 | -1 |
| 88 | 0011110000011 | +1 | 0011000001100110 | -3 | 1110011011100 | +3 | 1110010000001 | -1 |
| 89 | 0011110001110 | +1 | 0011000001110001 | -3 | 1110011001110 | +3 | 1110011000001 | -1 |
| 8A | 0011110001001 | +1 | 0011000011000011 | -3 | 1110011001100 | +3 | 1110011000001 | -1 |
| 8B | 0011110011001 | +1 | 0011000011000110 | -3 | 1110011001100 | +3 | 1110011000000 | -1 |
| 8C | 0011110011100 | +1 | 0011000011000001 | -3 | 1110011001100 | +3 | 1110000000011 | -1 |
| 8D | 0011110110001 | +1 | 0011000110001100 | -3 | 1110011111000 | +3 | 1110000000011 | -1 |
| 8E | 0011111000011 | +1 | 0011000110000001 | -3 | 1110000011110 | +3 | 1110000000011 | -1 |
| 8F | 0011111000110 | +1 | 0011000111000000 | -3 | 1110000011000 | +3 | 1110000001100 | -1 |

FIG. 7B

| 8-BIT DATA WORD (HEX) | CODEWORD | CDS | CODEWORD | CDS | CODEWORD | CDS | CODEWORD | CDS |
|---|---|---|---|---|---|---|---|---|
| 90 | 0011111000111100 | +1 | 0011001100000011 | -3 | 1111100001111001 | +3 | 1111100001110000 | -1 |
| 91 | 0011111100111000 | +1 | 0011001100000110 | -3 | 1111100001111100 | +3 | 1111100001100000 | -1 |
| 92 | 0011111111000001 | +1 | 0011001100011100 | -3 | 1111100011000011 | +3 | 1111100111000000 | -1 |
| 93 | 0110000011111111 | +3 | 0110000000011111 | -1 | 1000000011111111 | +1 | 1000000001111110 | -3 |
| 94 | 0110000111111110 | +3 | 0110000000111110 | -1 | 1000000111111110 | +1 | 1000000011100111 | -3 |
| 95 | 0110001100011111 | +3 | 0110000001100111 | -1 | 1000011001111111 | +1 | 1000000011001111 | -3 |
| 96 | 0110001110001111 | +3 | 0110000011001111 | -1 | 1000011100111111 | +1 | 1000000011111100 | -3 |
| 97 | 0110001111000111 | +3 | 0110000011100111 | -1 | 1000011110011111 | +1 | 1000000110000111 | -3 |
| 98 | 0110001111100011 | +3 | 0110000011110011 | -1 | 1000011111001111 | +1 | 1000000111001110 | -3 |
| 99 | 0110001111111001 | +3 | 0110000111000111 | -1 | 1000011111110011 | +1 | 1000000111100011 | -3 |
| 9A | 0110001111111100 | +3 | 0110000111100011 | -1 | 1000100011111111 | +1 | 1000000111110000 | -3 |
| 9B | 0110011000011111 | +3 | 0110000111110001 | -1 | 1000100111111110 | +1 | 1000000111100110 | -3 |
| 9C | 0110011100011110 | +3 | 0110000111110010 | -1 | 1000100111001111 | +1 | 1000000111110001 | -3 |
| 9D | 0110011110001111 | +3 | 0110000111110001 | -1 | 1000110011001111 | +1 | 1000001011110000 | -3 |
| 9E | 0110011111001110 | +3 | 0110000111111000 | -1 | 1000110011111110 | +1 | 1000001100000111 | -3 |
| 9F | 0110011111000111 | +3 | 0110000110000111 | -1 | 1000111110001111 | +1 | 1000001100001110 | -3 |

FIG. 8A

| 8-BIT DATA WORD (HEX) | CODEWORD | CDS | CODEWORD | CDS | CODEWORD | CDS | CODEWORD | CDS |
|---|---|---|---|---|---|---|---|---|
| A0 | 01100111001110 | +3 | 01100011000110 | −1 | 10000111001110 | +1 | 10000110011001 | −3 |
| A1 | 01100111100011 | +3 | 01100011001100 | −1 | 10000111100011 | +1 | 10000110011100 | −3 |
| A2 | 01100111100110 | +3 | 01100011001100 | −1 | 10000111100110 | +1 | 10000111000011 | −3 |
| A3 | 01100111110001 | +3 | 01100011000011 | −1 | 10000111110001 | +1 | 10000111000110 | −3 |
| A4 | 01100111111000 | +3 | 01100011000110 | −1 | 10000111111000 | +1 | 10000111001100 | −3 |
| A5 | 01100000111111 | +3 | 01100011001100 | −1 | 10001000001111 | +1 | 10000111100001 | −3 |
| A6 | 01100001111110 | +3 | 01100011110000 | −1 | 10001000011110 | +1 | 10000111110000 | −3 |
| A7 | 01100010001111 | +3 | 01100011111110 | −1 | 10001100110011 | +1 | 10000110000111 | −3 |
| A8 | 01100011100111 | +3 | 01100110000111 | −1 | 10001100110011 | +1 | 10000110001110 | −3 |
| A9 | 01100011110011 | +3 | 01100110001110 | −1 | 10001100011111 | +1 | 10000110001110 | −3 |
| AA | 01100011111001 | +3 | 01100110011001 | −1 | 10001100111100 | +1 | 10000110011001 | −3 |
| AB | 01100011111100 | +3 | 01100110011100 | −1 | 10001100000111 | +1 | 10000110110001 | −3 |
| AC | 01100100011111 | +3 | 01100110110001 | −1 | 10001110001111 | +1 | 10000110001110 | −3 |
| AD | 01100110011111 | +3 | 01100100111000 | −1 | 10001110011001 | +1 | 10000111000011 | −3 |
| AE | 01100111000111 | +3 | 01100111000011 | −1 | 10001100011001 | +1 | 10000110000110 | −3 |
| AF | 01100111001110 | +3 | 01100111000110 | −1 | 10001110011100 | +1 | 10000110001100 | −3 |

FIG. 8B

| 8-BIT DATA WORD (HEX) | CODEWORD | CDS | CODEWORD | CDS | CODEWORD | CDS | CODEWORD | CDS |
|---|---|---|---|---|---|---|---|---|
| B0 | 0111001110000011 | +3 | 0110011001100 | −1 | 1000111110000111 | +1 | 1000011100011000 | −3 |
| B1 | 0110011100110 | +3 | 0110011011000 | −1 | 1000111110001110 | +1 | 1000011110000001 | −3 |
| B2 | 0110011110001 | +3 | 0110011111000001 | −1 | 1000111110011001 | +1 | 1000011111100000 | −3 |
| B3 | 0110011111000 | +3 | 0110011111100000 | −1 | 1000111110011100 | +1 | 1000011000000111 | −3 |
| B4 | 0111000011111 | +3 | 0111000000011110 | −1 | 1000111111000011 | +1 | 1000011000001110 | −3 |
| B5 | 0111000111110 | +3 | 0111000001100011 | −1 | 1000111111000110 | +1 | 1000011000011001 | −3 |
| B6 | 0111000110011 | +3 | 0111000011000011 | −1 | 1000111111001100 | +1 | 1000011000011100 | −3 |
| B7 | 0111000110011 | +3 | 0111000001111001 | −1 | 1000111111000001 | +1 | 1000011000110001 | −3 |
| B8 | 0111000111100 | +3 | 0111000011111100 | −1 | 1000111111110000 | +1 | 1000011000111000 | −3 |
| B9 | 0111000111110 | +3 | 0111000001100011 | −1 | 1000100000011111 | +1 | 1000011001100001 | −3 |
| BA | 0111000111110 | +3 | 0111000001000110 | −1 | 1000100000111110 | +1 | 1000011001110000 | −3 |
| BB | 0111001100011 | +3 | 0111000001111001 | −1 | 1000100000100111 | +1 | 1000011100000011 | −3 |
| BC | 0111001101110 | +3 | 0111000001111000 | −1 | 1000100001100111 | +1 | 1000011100000110 | −3 |
| BD | 0111001110011 | +3 | 0111000010000011 | −1 | 1000100011111001 | +1 | 1000011100001100 | −3 |
| BE | 0111001111001 | +3 | 0111000110000110 | −1 | 1000100011111100 | +1 | 1000011100011000 | −3 |
| BF | 0111001111000 | +3 | 0111000110001100 | −1 | 1000100110011111 | +1 | 1000011100110000 | −3 |

FIG. 9A

| 8-BIT DATA WORD (HEX) | CODEWORD | CDS | CODEWORD | CDS | CODEWORD | CDS | CODEWORD | CDS |
|---|---|---|---|---|---|---|---|---|
| C0 | 01111000001111 | +3 | 01110001100001 | -1 | 10011001100110 | +1 | 10001110000001 | -3 |
| C1 | 01111000011110 | +3 | 01110001110000 | -1 | 10011001100011 | +1 | 10001111000000 | -3 |
| C2 | 01111000110011 | +3 | 01110011000011 | -1 | 10011001100110 | +1 | 10010000000111 | -3 |
| C3 | 01111000111001 | +3 | 01110011000110 | -1 | 10011001110010 | +1 | 10010000001110 | -3 |
| C4 | 01111000111100 | +3 | 01110011001100 | -1 | 10011001111000 | +1 | 10010000011001 | -3 |
| C5 | 01111001100011 | +3 | 01110011011000 | -1 | 10011000001111 | +1 | 10010000011100 | -3 |
| C6 | 01111001100110 | +3 | 01110011100000 | -1 | 10011100011110 | +1 | 10010000110001 | -3 |
| C7 | 01111001110001 | +3 | 01110011110000 | -1 | 10011100110001 | +1 | 10010000111000 | -3 |
| C8 | 01111001111000 | +3 | 01110000000111 | -1 | 10011100111100 | +1 | 10010001100001 | -3 |
| C9 | 01111100000111 | +3 | 01110000001110 | -1 | 10011100111100 | +1 | 10010001110000 | -3 |
| CA | 01111100001110 | +3 | 01110000011001 | -1 | 10011001100110 | +1 | 10010011000001 | -3 |
| CB | 01111100011001 | +3 | 01110000011100 | -1 | 10011001100110 | +1 | 10010011000000 | -3 |
| CC | 01111100011100 | +3 | 01110000110001 | -1 | 10011001111000 | +1 | 10011100000011 | -3 |
| CD | 01111100110001 | +3 | 01110000111000 | -1 | 10011100100110 | +1 | 10011100000110 | -3 |
| CE | 01111100111000 | +3 | 01110001100001 | -1 | 10011100000111 | +1 | 10011100001100 | -3 |
| CF | 01111110000011 | +3 | 01110001110000 | -1 | 10011100001110 | +1 | 10011100011000 | -3 |

FIG. 9B

| 8-BIT DATA WORD (HEX) | CODEWORD | CDS | CODEWORD | CDS | CODEWORD | CDS | CODEWORD | CDS |
|---|---|---|---|---|---|---|---|---|
| D0 | 0111111000110 | +3 | 0111100110000001 | −1 | 1001110011001 | +1 | 1001100110000 | −3 |
| D1 | 0111110001100 | +3 | 0111100111100000 | −1 | 1001110011100 | +1 | 1001110010000 | −3 |
| D2 | 0111110011000 | +3 | 0111100000000011 | −1 | 1001110011000 | +1 | 1001110000001 | −3 |
| D3 | 0110000001111 | +1 | 0110000000001111 | −3 | 1000001111111 | +3 | 1000000011111 | −1 |
| D4 | 0110000011110 | +1 | 0110000000011110 | −3 | 1000110011111 | +3 | 1000000111110 | −1 |
| D5 | 0110000110011 | +1 | 0110000000110011 | −3 | 1000011100111 | +3 | 1000000110011 | −1 |
| D6 | 0110000111001 | +1 | 0110000000111001 | −3 | 1000011111111 | +3 | 1000000111001 | −1 |
| D7 | 0110000111100 | +1 | 0110000001110011 | −3 | 1000011111001 | +3 | 1000000111100 | −1 |
| D8 | 0110001111001 | +1 | 0110000001100110 | −3 | 1000011111111 | +3 | 1000001111001 | −1 |
| D9 | 0110001111100 | +1 | 0110000001110001 | −3 | 1000011111111 | +3 | 1000000110011 | −1 |
| DA | 0110001100111 | +1 | 0110000001111000 | −3 | 1000100011110 | +3 | 1000001100111 | −1 |
| DB | 0110001100110 | +1 | 0110000011111000 | −3 | 1000011001111 | +3 | 1000001100110 | −1 |
| DC | 0110001100111 | +1 | 0110000011000011 | −3 | 1000100110111 | +3 | 1000001100111 | −1 |
| DD | 0110001110110 | +1 | 0110000011000110 | −3 | 1000011001110 | +3 | 1000001110110 | −1 |
| DE | 0110001110011 | +1 | 0110000011001100 | −3 | 1000011110011 | +3 | 1000001110011 | −1 |
| DF | 0110001110011 | +1 | 0110000011110000 | −3 | 1000111100111 | +3 | 1000001110011 | −1 |

FIG. 10A

| 8-BIT DATA WORD (HEX) | CODEWORD | CDS | CODEWORD | CDS | CODEWORD | CDS | CODEWORD | CDS |
|---|---|---|---|---|---|---|---|---|
| E0 | 0110001111100001 | +1 | 0110000111110000 | -3 | 1000111110011110 | +3 | 1000000111110001 | -1 |
| E1 | 0110001111111000 | +1 | 0110001100000011 | -3 | 1000111111000111 | +3 | 1000001111111000 | -1 |
| E2 | 0110010000011111 | +1 | 0110001100000110 | -3 | 1000111111001110 | +3 | 1000011000011111 | -1 |
| E3 | 0110010001111110 | +1 | 0110001100001100 | -3 | 1000111111100011 | +3 | 1000011000111110 | -1 |
| E4 | 0110010011100011 | +1 | 0110001100011000 | -3 | 1000111111100110 | +3 | 1000011001100011 | -1 |
| E5 | 0110010011111001 | +1 | 0110001110000001 | -3 | 1000111111110001 | +3 | 1000011001110001 | -1 |
| E6 | 0110010011111100 | +1 | 0110001110000000 | -3 | 1000111111111000 | +3 | 1000011001111100 | -1 |
| E7 | 0110011100000111 | +1 | 0110011100000011 | -3 | 1001100001111111 | +3 | 1000011110000111 | -1 |
| E8 | 0110011100001110 | +1 | 0110011100000110 | -3 | 1001100011111110 | +3 | 1000011110001110 | -1 |
| E9 | 0110011100011001 | +1 | 0110011100001100 | -3 | 1001100110001111 | +3 | 1000011110011001 | -1 |
| EA | 0110011100011100 | +1 | 0110011100011000 | -3 | 1001100110011111 | +3 | 1000011110011100 | -1 |
| EB | 0110011111000011 | +1 | 0110011100110000 | -3 | 1001100111001111 | +3 | 1000011111000011 | -1 |
| EC | 0110011111001100 | +1 | 0110011110000001 | -3 | 1001100111100011 | +3 | 1000011111001100 | -1 |
| ED | 0110011111001100 | +1 | 0110011110000000 | -3 | 1001100111110001 | +3 | 1000011111001100 | -1 |
| EE | 0110011111100001 | +1 | 0111000000000111 | -3 | 1001100111111100 | +3 | 1000011111100001 | -1 |
| EF | 0110011111110000 | +1 | 0111000000001110 | -3 | 1001110001111110 | +3 | 1000011111110000 | -1 |

FIG. 10B

| 8-BIT DATA WORD (HEX) | CODEWORD | CDS | CODEWORD | CDS | CODEWORD | CDS | CODEWORD | CDS |
|---|---|---|---|---|---|---|---|---|
| F0 | 0110000001111 | +1 | 0110000011001 | -3 | 1001100100111 | +3 | 1000110000111 | -1 |
| F1 | 0110000111110 | +1 | 0110000011100 | -3 | 1001100110011 | +3 | 1000110000110 | -1 |
| F2 | 0110001100111 | +1 | 0110000110001 | -3 | 1001100111001 | +3 | 1000110011001 | -1 |
| F3 | 0110001110011 | +1 | 0110000111000 | -3 | 1001100111100 | +3 | 1000110011100 | -1 |
| F4 | 0110001111001 | +1 | 0110001100001 | -3 | 1001110000111 | +3 | 1000110001111 | -1 |
| F5 | 0110001111100 | +1 | 0110001110000 | -3 | 1001110001110 | +3 | 1000110110011 | -1 |
| F6 | 0110011000111 | +1 | 0110011000001 | -3 | 1001110011001 | +3 | 1000110100110 | -1 |
| F7 | 0110011001110 | +1 | 0110011000100 | -3 | 1001110011100 | +3 | 1000110110110 | -1 |
| F8 | 0110011100011 | +1 | 0110011000000 | -3 | 1001110111000 | +3 | 1000110110001 | -1 |
| F9 | 0110011100110 | +1 | 0110011000000 | -3 | 1001111000011 | +3 | 1000111000011 | -1 |
| FA | 0110011110001 | +1 | 0110110000011 | -3 | 1001111001110 | +3 | 1000111000110 | -1 |
| FB | 0110011111000 | +1 | 0110110000110 | -3 | 1001111011001 | +3 | 1000111001001 | -1 |
| FC | 0110011000011 | +1 | 0110110001100 | -3 | 1001111011100 | +3 | 1000111001100 | -1 |
| FD | 0110011000110 | +1 | 0110110000001 | -3 | 1001111100011 | +3 | 1000111100001 | -1 |
| FE | 0110011001001 | +1 | 0110110000010 | -3 | 1001111100110 | +3 | 1000111101000 | -1 |
| FF | 0110011001100 | +1 | 0110110001100 | -3 | 1001111001100 | +3 | 1000111000011 | -1 |

FIG. 12

| RDn-CDn | CDn-CDn+1 | CODE PAIR (+1,-3) +1 | CODE PAIR (+1,-3) -3 | CODE PAIR (+3,-1) +3 | CODE PAIR (+3,-1) -1 |
|---|---|---|---|---|---|
| +2 | +1<br>0<br>-1 | | OO<br>O | | OOO<br>OOO<br>OO |
| +1 | +1<br>0<br>-1 | O<br>OO | | | OOO<br>OO |
| 0 | +1<br>0<br>-1 | OOO<br>OOO | | O | |
| -1 | +1<br>0<br>-1 | OOO | | OO | O |

8-BIT DATA WORD TO 15-BIT CODEWORD CONVERTER UTILIZING PERIODICALLY VARYING DIGITAL SUM VARIATION

BACKGROUND OF THE INVENTION

1. Field of the Invention

The present invention relates generally to digital modulating methods and a digital modulating apparatus using the same, and particularly to a coding method in digital recording.

2. Description of the Background Art

Coding in digital recording means is utilized to convert a data word sequence with bit intervals of Tb into a codeword sequence with bit intervals of Ts according to a certain rule (a coding rule). Also, coding in which a data word sequence is divided for each information of m bits (m≧2) and sequentially converted into a codeword of n bits (n≧m) is called block coding. The converted codeword sequence is further converted (modulated) into a recording pattern sequence (recording current form) according to the NRZL rule or the NRZI rule.

Now, coding according to the NRZL rule will be described. In the NRZL rule, a bit "0" corresponds to a certain level (e.g., a low level) and a bit "1" corresponds to another level (e.g., a high level) in a codeword sequence. If a minimum value of the number of continuing same bits in a codeword sequence is expressed as a parameter d (corresponding to a minimum runlength) and a maximum value thereof is expressed as a parameter k (corresponding to a maximum runlength), a minimum length between transitions Tmin and a maximum length between transitions Tmax are expressed as the following expressions, respectively.

$$Tmin = (m/n) \cdot d \cdot Tb \quad (1)$$

$$Tmax = (m/n) \cdot k \cdot Tb \quad (2)$$

Also, a ratio Tmin/Tb of the minimum length between transitions Tmin and the bit interval Tb of a data word sequence is referred to as a Density Ratio DR, which is expressed as the following expression.

$$DR = (m/n) \cdot d \quad (3)$$

In digital modulation, it is preferred that the minimum length between transitions Tmin is long and the maximum length between transitions Tmax is short. Also, a larger density ratio DR is more advantageous in high density recording. The relation among a data word sequence, a codeword sequence and a recording pattern sequence is shown in FIG. 15.

Accumulated charge obtained by, assigning charge +1 to a high level of a recording pattern sequence and assigning charge −1 to a low level, sequentially adding charges from the beginning of a recording pattern sequence is called DSV (Digital Sum Variation). That is to say, the DSV shows the difference between the numbers of bits "1" and bits "0" from the beginning to a certain bit in a recording pattern sequence. In the block coding, a total sum of charge in one codeword is called CDS (Code-word Digital Sum). That is to say, the CDS shows the difference between the numbers of bits "1" and bits "0" in one codeword.

Digital modulating methods according to the block coding method include the 8-10 modulating method in which a 8-bit data word is converted into a 10-bit codeword and then NRZ-or NRZI-modulated and recorded, the 8-14 modulating method in which a 8-bit data word is converted into a 14-bit codeword, NRZ or NRZI modulated and recorded, and so forth.

In order to precisely trace recording tracks in reproducing, tracking control is performed such as ATF (Automatic Track Finding), DTF (Dynamic Track Following) and so forth. It is necessary to record a pilot signal in each track of a recording medium for the tracking control. As a method of recording such a pilot signal, there is a recording method in which a pilot signal is superimposed upon digitally modulated data. This method, however, has problems, for example, that a reproduced signal is likely to undergo crosstalk disturbance due to a pilot signal in reproducing.

Accordingly, the 8-10 modulating method, the 12-15 modulating method and so forth are proposed in which control is performed so that DSV varies periodically in digital modulation and the periodical variation of DSV is used as a pilot signal. Such a 8-10 modulating method and a 12-15 modulating method are respectively described in IEEE Transactions on Consumer Electronics, Vol. 34, No. 3, August 1988, pp. 597–605 and Institute of Television Engineers of Japan (ITEJ) Technical Report Vol. 14, No. 41, VIR '90-43, August 1990, pp. 1–6. In these modulating methods, tracking control is enabled with variation periods of DSV being different for each track. According to such modulating methods, a reproduced signal is prevented from undergoing crosstalk disturbance due to a pilot signal.

In the above-described 8-10 modulating method and 12-15 modulating method, the minimum length between transitions Tmin is 0.8 Tb and the density ratio DR is 0.8. Thus, since the density ratio DR is smaller than 1, it is disadvantageous to high density recording.

SUMMARY OF THE INVENTION

It is an object of the present invention to provide a digital modulating method and a digital modulating apparatus with smaller crosstalk disturbance due to a pilot signal which is advantageous for high density recording.

A digital modulating method according to the present invention includes a step of assigning a plurality of 15-bit codewords to each 8-bit data word so that the number of continuous identical bits is not less than 2 and not more than 8 in a 15-bit codeword sequence, and a step of selecting one of the plurality of 15-bit codewords assigned to each 8-bit data word so that DSV at a last bit of each 15-bit codeword periodically changes.

The assigning step may include, producing a plurality of first code pairs each including a 15-bit codeword with CDS equal to +3 and a 15-bit codeword of which CDS is equal to −1 and a plurality of second code pairs each including a 15-bit codeword of which CDS is equal to +1 and a 15-bit codeword of which CDS is equal to −3, assigning one of the plurality of first code pairs and one of the plurality of second code pairs to each 8-bit data word, and selecting one of the first and second code pairs assigned to each 8-bit data word so that the number of continuing identical bits is not less than 2 and not more than 8 in a 15-bit codeword sequence.

Also, in the selecting step, one of two 15-bit codewords included in a selected code pair may be selected so that DSV at a last bit of each 15-bit codeword periodically varies.

In a digital modulating method according to the present invention, since the number of identical bits which are continuous in a 15-bit codeword sequence is not less than 2 and not more than 8, n=15, m=8, d=2 and k=8 in the expressions (1) and (2). Accordingly, from the expression (1), the minimum length between transitions Tmin is 1.07 Tb and the maximal length between transitions Tmax is 4.27 Tb. Also, from the expression (3), the density ratio DR is 1.07. As described above, the density ratio DR is larger than 1.

Also, since one of a plurality of 15-bit codewords assigned to each 8-bit data word is selected so that DSV at a last bit of each 15-bit codeword periodically varies, the periodical variation of DSV can be used as a pilot signal. Such a pilot signal does not give crosstalk disturbance to a reproduced signal in reproducing.

A digital modulating apparatus according to the present invention includes a control circuit for generating a control signal for periodically changing DSV at a last bit of each 15-bit codeword, and a converting circuit for sequentially converting each 8-bit data word into a 15-bit codeword so that the number of continuing identical bits in the 15-bit codeword sequence is not less than 2 and not more than 8 in response to a control signal generated from the control circuit.

The converting circuit may produce a plurality of first code pairs each including a 15-bit codeword with CDS equal to $+3$ and a 15-bit codeword with CDS equal to $-1$ and a plurality of second code pairs each including a 15-bit codeword with CDS equal to $+1$ and a 15-bit codeword with CDS equal to $-3$, assign one of the plurality of first code pairs and one of the plurality of second code pairs to each 8-bit data word, and select one of the first and second code pairs assigned to each 8-bit data word so that the number of continuous identical bits is not less than 2 and not more than 8 in a 15-bit codeword sequence.

Also, the converting circuit may select one of two 15-bit codewords included in the selected code pair so that DSV at a final bit of each 15-bit codeword periodically varies.

A control signal may indicate a difference between a current control value of DSV and a next control value of DSV, and the converting means may sequentially convert each 8-bit data word into a 15-bit codeword on the basis of the difference between the current control value of DSV and the next control value of DSV, and a current real value of DSV.

According to the digital modulating apparatus according to the present invention, a 8-bit data word sequence is converted into a 15-bit codeword sequence so that a density ratio DR is larger than 1 and DSV at a last bit of each 15-bit codeword periodically changes. Accordingly, high density recording is enabled and also, the crosstalk disturbance due to a pilot signal can be avoided.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a diagram illustrating a table of codewords sorted on the basis of initial two bits and CDS.

FIG. 2 is a diagram illustrating an example of assigning sorted codewords to 8-bit data words of 0 through 255.

FIGS. 3a and 3b are diagrams illustrating an example of assigning four codewords to each 8-bit data word.

FIGS. 4a and 4b are diagrams illustrating an example of assigning four codewords to each 8-bit data word.

FIGS. 5a and 5b are diagrams illustrating an example of assigning four codewords to each 8-bit data word.

FIGS. 6a and 6b are diagrams illustrating an example of assigning four codewords to each 8-bit data word.

FIGS. 7a and 7b are diagrams illustrating an example of assigning four codewords to each 8-bit data word.

FIGS. 8a and 8b are diagrams illustrating an example of assigning four codewords to each 8-bit data word.

FIGS. 9a and 9b are diagrams illustrating an example of assigning four codewords to each 8-bit data word.

FIGS. 10a and 10b are diagrams illustrating an example of assigning four codewords to each 8-bit data word.

FIG. 12 is a diagram illustrating selection of codewords on the basis of control conditions.

DESCRIPTION OF THE PREFERRED EMBODIMENTS

Figure 11:
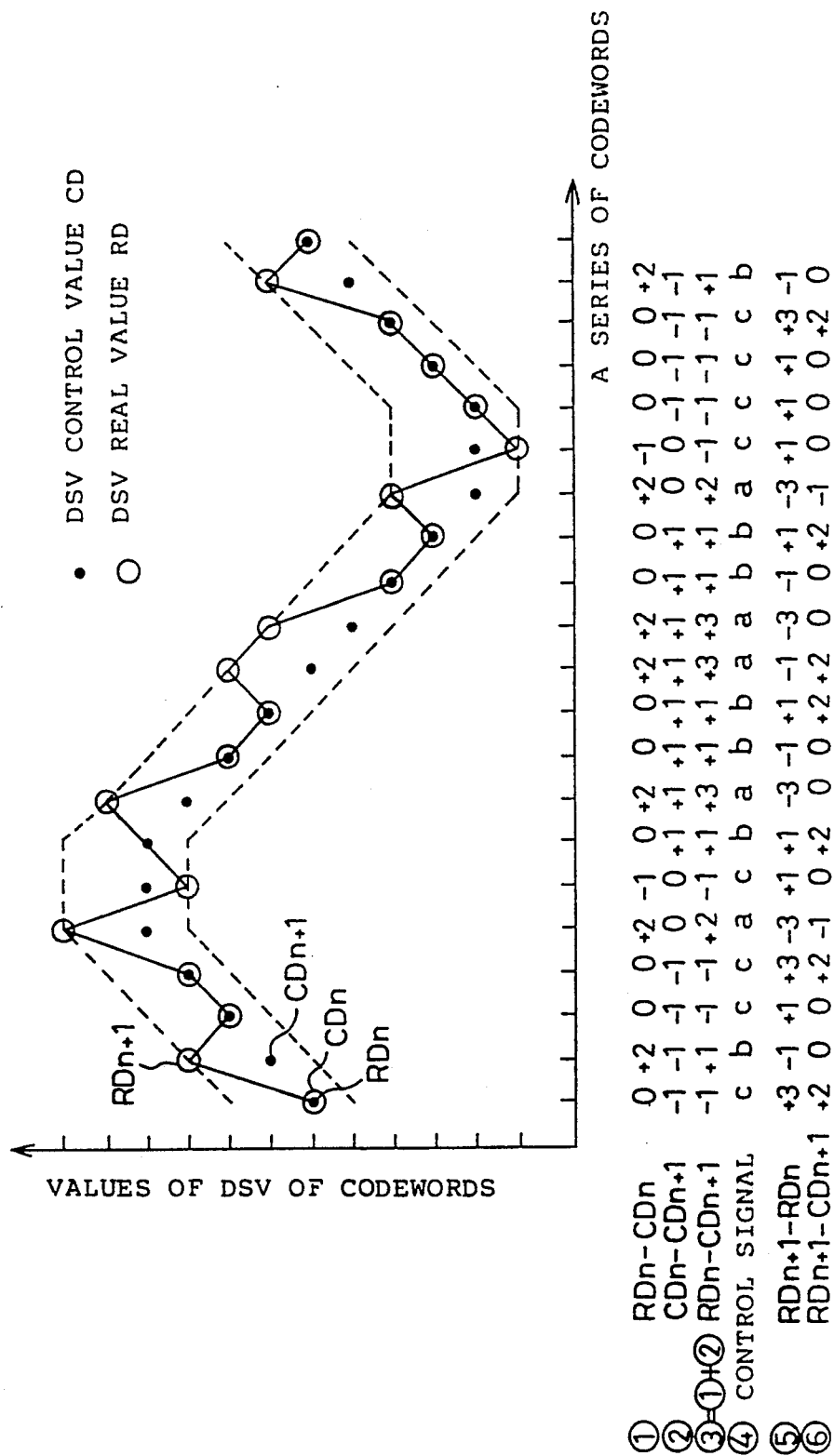
FIG. 11 is a diagram illustrating a modulation example using the digital modulating method according to one embodiment of the present invention.

Referring to FIGS. 1 through 12, a digital modulating method according to one embodiment of the present invention will be described.

In the digital modulating method of this embodiment, a 15-bit codeword corresponding to each 8-bit data word is determined according to the following procedures so that DSV at a final bit of each codeword periodically changes and also predetermined conditions are satisfied.

First, codes which satisfy the following conditions (1) through (4) are selected as candidates of codewords in 2 of 15-bit codewords (hereinafter, simply referred to as a codeword).

(1) The number of continuous identical bits at a beginning portion of a codeword is 7 or smaller.

(2) The number of continuing identical bits at an ending portion of a codeword is 7 or smaller.

(3) The number of continuous identical bits is not less than 2 and not more than 8 from a second bit to a fourteenth bit in a codeword.

(4) An absolute value of CDS of a codeword is not more than 3.

With the conditions (1) through (3), the number of continuing identical bits can be not less than 2 and not more than 8 in a codeword sequence. Since the number of continuous same bits is 2 or larger in a codeword sequence, d=2 in expression (1). Accordingly, the minimum length between transitions Tmin is 1.07 Tb. Also, since the number of continuous identical bits is 8 or smaller in a codeword sequence, k=8 in expression (2). Accordingly, the maximum length between transitions Tmax is 4.27 Tb. Also, from expression (3), the density ratio DR is 1.07. Although a shorter maximum length between transitions Tmax is more preferable, a maximum value of the number of identical bits which are continuous in a codeword sequence is set to 8 to facilitate production of 256 different codewords corresponding to 256 of 8-bit data words.

Next, the candidate codewords are respectively sorted into groups of codewords starting with "00", "01", "10" and "11", and each group of codewords is further sorted into codewords of which CDS are equal to $+3$, $+1$, $-1$, $-3$ respectively. The numbers of codewords thus sorted are shown in FIG. 1.

For example, in the codewords beginning with "00", the number of codewords having CDS of $+3$, $+1$, $-1$, $-3$ are 54, 95, 120, 115, respectively.

Furthermore, for codewords respectively starting with "00", "01", "10", "11", first code pairs $(+3, -1)$ are produced including codewords with CDS of $+3$ and codewords with CDS of $-1$ and second code pair $(+1, -3)$ are produced including codewords with CDS of $+1$ and codewords of CDS of $-3$.

One of the plurality of first code pairs $(+3, -1)$ and one of the second code pairs $(+1, -3)$ are assigned to each of 8-bit data words of 0 through 255. As described above, four codewords are assigned to each of 8-bit data words. The number of code pairs sorted on the basis of initial two bits and the number of codeword pairs assigned to 8-bit data words are shown in FIG. 2.

For example, the number of first code pairs $(+3, -1)$ including codewords beginning with "00" is 54, and 53 of the first code pairs $(+3, -1)$ are assigned to 8-bit data words of 0 through 52. An example of assigning four codewords to each of 8-bit data words is shown in FIGS. 3a through 10b.

Now, combining conditions among codewords will be described. If codewords are selected according to the combining conditions (A) through (D) shown below, the number of continuing identical bits at combining portions among codewords can be not less than 2 and not more than 8.

(A) When last 2 bits of a preceding codeword are "00", a codeword starting with "11" or "01" is selected.

(B) When last 2 bits of a preceding codeword are "01", a codeword beginning with "11" or "10" is selected.

(C) When final 2 bits of a preceding codeword is "10", a codeword beginning with "00" or "01" is selected.

(D) When final 2 bits of a preceding codeword is "11", a codeword beginning with "00" or "10" is selected.

As seen from FIG. 2, regardless of the previous codeword, a code pair which satisfies the above-identified combining conditions (A) through (D) can be prepared for each 8-bit data word.

For example, let us consider selection of codewords for 8-bit data words of 0 through 52. When the last two bits of the previous codeword are "00" or "01", a second code pair $(+1, -3)$ including codewords beginning with "11" can be selected. This satisfies the combining conditions (A) and (B). When final two bits of the previous codeword are "10" or "11", a first code pair $(+3, -1)$ including codewords beginning with "00" can be selected. This satisfies the combining conditions (C), (D).

According to the following control conditions (a), (b), a control value CD of DSV at the last bit of each codeword and a real value RD of DSV at the last bit of each codeword are determined. A control value of DSV at the last bit of each codeword is referred to as a control value of DSV and a real value of DSV at the last bit of each codeword is referred to as a real value of DSV, hereinafter. A control value CD of DSV means a target value of DSV which periodically changes.

(a) A difference between the current control value $CD_n$ of DSV and the next control value $CD_{n+1}$ of DSV is set to either one of $-1, 0, +1$.

If $CD_n - CD_{n+1}$ is set to $-1$, a control value CD of DSV changes in a positive direction, and if it is set to $+1$, a control value CD of DSV changes in the negative direction, and if it is set to 0, a control value CD of DSV maintains a constant value. From the control condition (a), the following expression holds.

$$-1 \leq CD_n - CD_{n+1} \leq 1 \qquad (4)$$

Control values CD of DSV are set as shown in FIG. 11, for example.

(b) A difference between a present real value $RD_n$ of DSV and a present control value $CD_n$ of DSV is set to a value not less than $-1$ and not more than $+2$. Accordingly, the expression below holds.

$$-1 \leq RD_n - CD_n \leq 2 \qquad (5)$$

On the basis of the control conditions (a) and (b), as shown in FIG. 12, one of codewords included in the first code pair $(+3, -1)$ or one of codewords included in the second code pair $(+1, -3)$ is selected as the next real value $RD_{n+1}$ of DSV in a one-to-one manner. This will be described below.

$$A = CD_n - CD_{n+1} \qquad (6)$$

$$B = RD_n - CD_n \qquad (7)$$

Then, the expression below holds.

$$A + B = RD_n - CD_{n+1} \qquad (8)$$

The expression below holds from expression (5).

$$-1 \leq RD_{n+1} - CD_{n+1} \leq 2 \qquad (9)$$

The expression below holds from expressions (8) and (9).

$$-1 - (A+B) \leq RD_{n+1} - RD_n \leq 2 - (A+B) \qquad (10)$$

$RD_{n+1} - RD_n$ is equal to CDS of the next codeword.
On the other hand, from expressions (4) and (5), the following expression holds.

$$-2 \leq A + B (= RD_n - CD_{n+1}) \leq 3 \qquad (11)$$

Accordingly, $A+B$ takes a value of 3 through $-2$.

When $A+B=3$, from expression (10), $-4 \leq CDS \leq -1$ holds. Accordingly, a codeword with CDS equal to $-1$ or $-3$ is selected.

If $A+B=2$, from expression (10), $-3 \leq CDS \leq 0$ holds. Accordingly, a codeword with CDS equal to $-1$ or $-3$ is selected.

If $A+B=1$, from expression (10), $-2 \leq CDS \leq 1$ holds. Accordingly, a codeword having CDS equal to $+1$ or $-1$ is selected.

If $A+B=0$, from expression (10), $-1 \leq CDS \leq 2$ holds. Accordingly, a codeword having CDS of $+1$ or $-1$ is selected.

If $A+B=-1$, from expression (10), $0 \leq CDS \leq 3$ holds. Accordingly, a codeword with CDS of $+1$ or $+3$ is selected.

If $A+B=-2$, from expression (10), $1 \leq CDS \leq 4$ holds. Accordingly, a codeword with CDS equal to $+3$ or $+1$ is selected.

In summary, if $A+B$ is 3 or 2, a codeword with CDS of $-1$ or $-3$ is selected. If $A+B$ is equal to 1 or 0, a codeword having CDS equal to $+1$ or $-1$ is selected. If $A+B$ is $-1$ or $-2$, a codeword with CDS equal to $+3$ or $+1$ is selected.

As described above, a real value RD of DSV varies inside a zone which changes periodically as shown by a broken line in FIG. 11. Accordingly, tracking control can be applied by using the DSV as a pilot signal.

Figure 13:
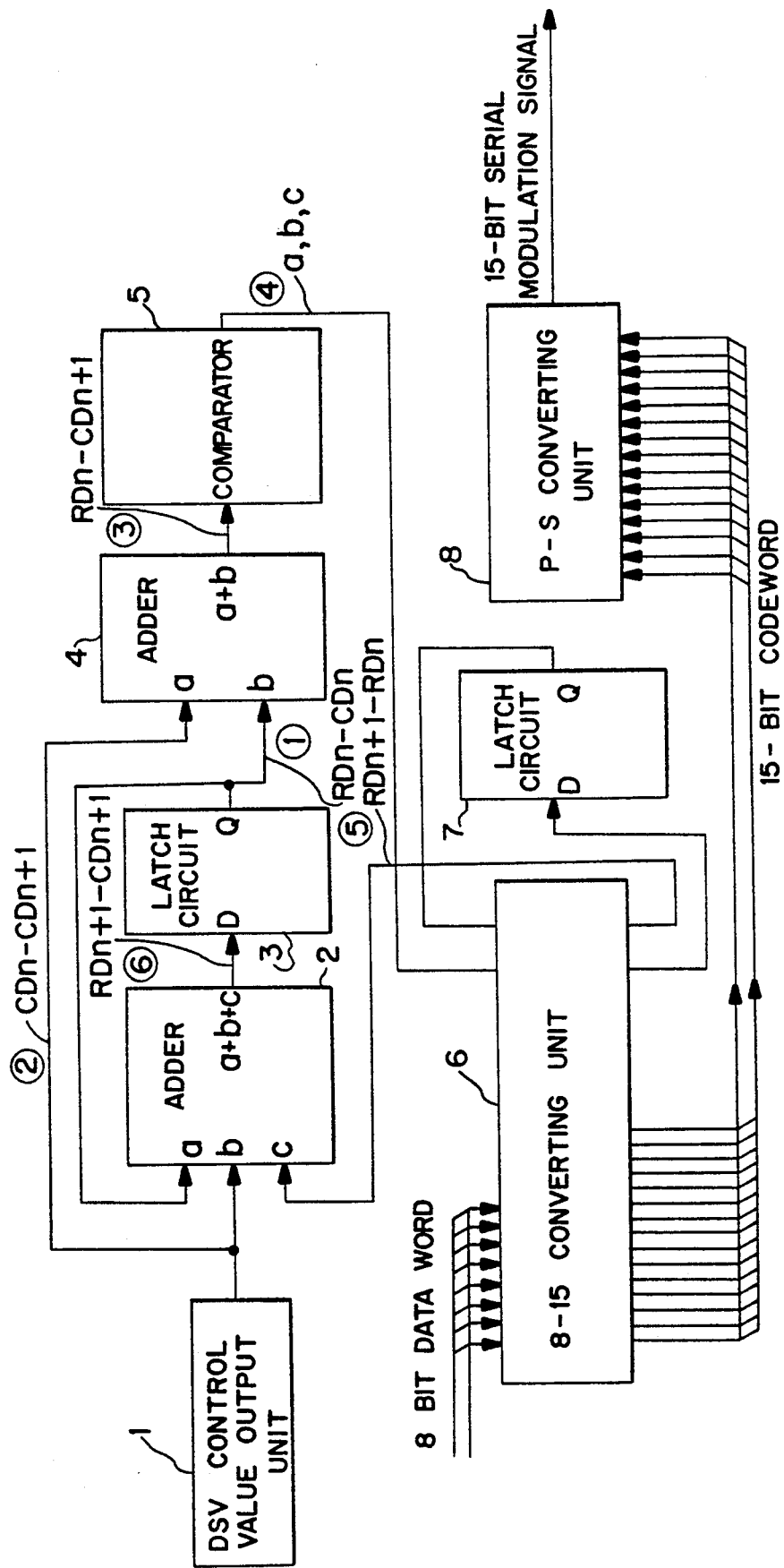
FIG. 13 is a block diagram of a modulating circuit using the digital modulating method according to one embodiment of the present invention.

FIG. 13 is a block diagram of a 8-15 modulating circuit using the digital modulating method of this embodiment.

A DSV control value output unit 1 controls amplitude and frequency of a pilot signal by controlling DSV. DSV control value output unit 1 provides a vector signal $(CD_n - CD_{n+1})$ for DSV control as an output. The vector signal indicates either one of "$-1$", "0", "$+1$" by the DSV control condition (a). When the vector signal indicates "$-1$", a DSV control value CD changes in a positive direction, when it indicates "$+1$", it changes in a negative direction, and if it indicates "0", it maintains a constant value (refer to FIG. 11).

An adder 2 obtains a sum of values applied to three input terminals a, b, c and provides the sum as an output from an output terminal. A difference between a current real value $RD_n$ of DSV and a current control value $CD_n$ of DSV, $(RDn-CDn)$, is applied to input terminal a and a vector signal $(CD_n - CD_{n+1})$ for DSV control is applied to input terminal b. A value $(RD_{n-1} - RD_n)$ of CDS of a codeword selected by a 8-15 converting unit 6 which will be described later is applied to input terminal c. Accordingly, a sum thereof $(RD_{n+1} - CD_{n+1})$ is provided as an output from the output terminal of adder 2. The sum attains "$-1$" through "$+2$" (refer to expression (9)). An output of adder 2 is latched in a latch circuit 3. An output of latch circuit 3 indicates a difference $(RD_n - CD_n)$ between a current real value $RD_n$ of DSV and a current control value $CD_n$ of DSV.

A sum of values provided to two input terminals a, b is found by adder 4, which is outputted from an output terminal. A vector signal $(CD_n - CD_{n+1})$ for DSV control is applied to input terminal a and an output $(RD_n - CD_n)$ of latch circuit 3 is applied to input terminal b. Accordingly, a sum $(RD_n - CD_{n+1})$ of those values is outputted from the output terminal of adder 4. The sum is "$-2$" through "$+3$" from control conditions of DSV (refer to expression (11)).

A comparator 5 provides a control signal a to 8-15 converting unit 6 when an output of adder 4 is "$+3$" or "$+2$", provides a control signal b to 8-15 converting unit 6 when an output thereof is "$+1$" or "0", and provides a control signal c to 8-15 converting unit 6 when an output thereof is "$-1$" or "$-2$". Latch circuit 7 temporality stores last two bits of a codeword.

8-15 converting unit 6 receives a 8-bit data word and provides a codeword as an output. That is, 8-15 converting unit 6 selects one of codewords on the basis of an inputted 8-bit data word, a control signal from comparator 5 and last two bits of the previous codeword stored in latch circuit 7 and provides the same as an output. 8-15 converting unit 6 selects a codeword with CDS of $-1$ or $-3$ when a control signal is "a", selects a codeword with CDS of $+1$ or $-1$ when a control signal is "b", and selects a codeword with CDS of $+3$ or $+1$ when a control signal is "c". Simultaneously, 8-15 converting unit 6 applies the last two bits of a codeword to latch circuit 7 and also provides a value $(RD_{n+1} - RD_n)$ of CDS of that codeword to adder 2.

A codeword (parallel data) outputted from 8-15 converting unit 6 is converted into 15-bit serial data (15-bit serial modulation signal) by a P-S (Parallel-Serial) converting unit 8.

For example, in FIG. 11, if $RD_n - CD_n = 0$, $CD_n - CD_{n+1} = -1$, then $A + B = RD_n - CD_{n+1} = -1$. Accordingly, a control signal is "c". Therefore, a codeword with CDS equal to $+3$ or $+1$ is selected. When a first code pair $(+3, -1)$ is selected, a codeword with CDS of $+3$ is selected, and when a second code pair $(+1, -3)$ is selected, a codeword of CDS of $+1$ is selected. As in the example shown in FIG. 11, when a first code pair $(+3, -1)$ is selected on the basis of an inputted 8-bit data word and the last two bits of the previous codeword, a codeword with CDS equal to $+3$ is selected. Thus, $RD_{n+1} - RD_n = +3$. As a result, $RD_{n+1} - CD_{n+1} = +2$.

As described above, a pilot signal necessary for the ATF method or the DTF method is obtained.

Next, an example of tracking control using the digital modulating method of this embodiment will be described.

For example, let a recording rate be 30 Mbps (bit per second). In this digital modulating method, DSV control is performed in 8-bit units, so that a reference frequency $f_{word}$ is 30 MHz/8 = 3.75 MHz. The reference frequency $f_{word}$ is frequency-divided as described below.

$f_1 = f_{word}/28 = 133.9$ KHz $f_2 = f_{word}/32 = 117.2$ KHz $f_3 = f_{word}/46 = 81.5$ KHz $f_4 = f_{word}/38 = 98.7$ KHz Codewords are determined so that values of DSV at the last bits of codewords change at these frequencies $f_1 - f_4$. The DSVs which vary at frequencies $f_1 - f_4$ are used as pilot signals of four frequencies. That is, one period includes 28 codewords in a pilot signal of frequency $f_1$, one period includes 32 codewords in a pilot signal of frequency $f_2$, one period includes 46 codewords in a pilot signal of frequency $f_3$, and one period includes 38 codewords in a pilot signal of frequency $f_4$.

Figure 14:
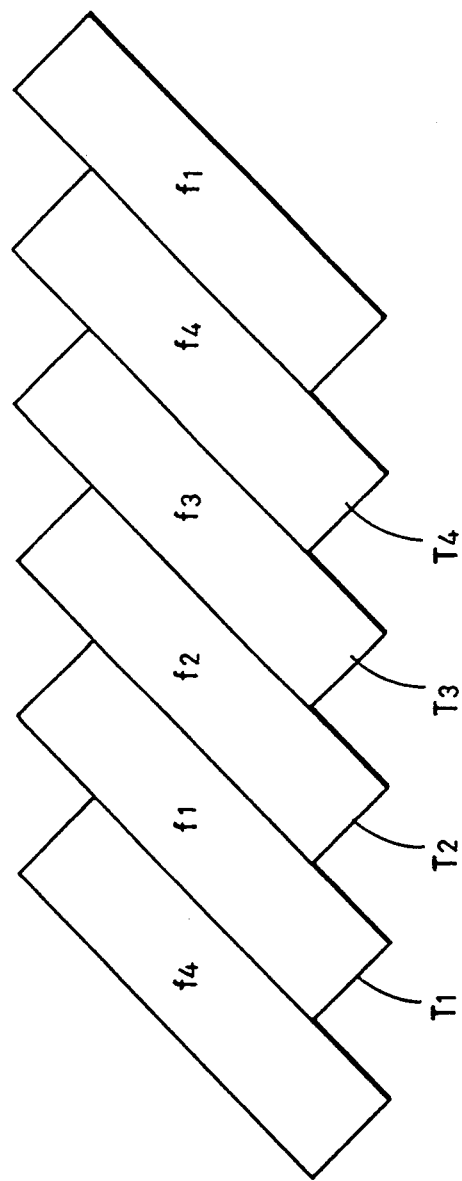
FIG. 14 is a diagram illustrating one example of tracking control with pilot signals of four frequencies.
Figure 15:
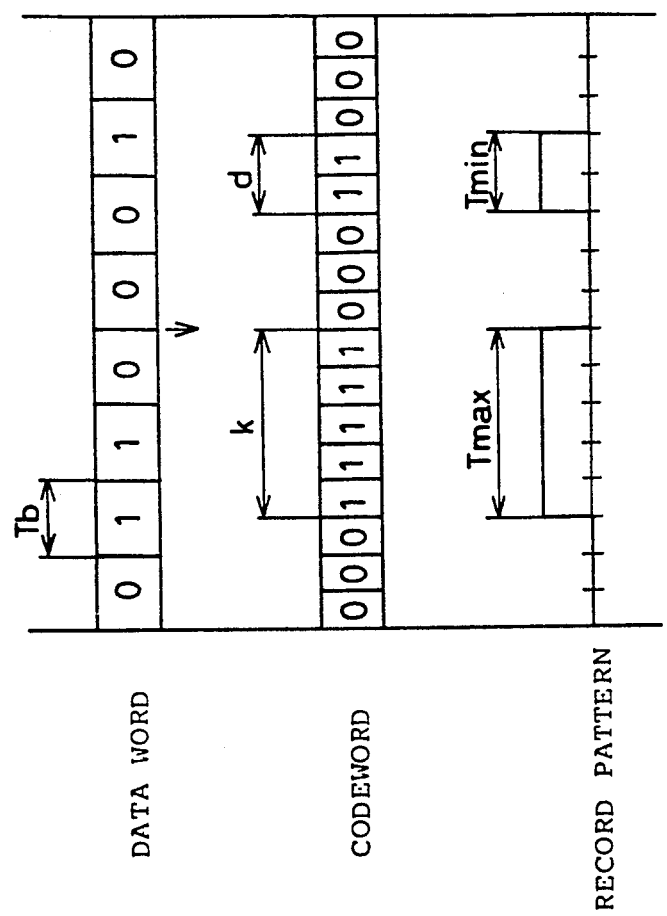
FIG. 15 is a diagram illustrating relation among a data word, a codeword and a recording pattern.

Control values CD of DSV are sequentially provided as outputs from DSV control value output unit 1 of FIG. 13 so that frequencies of pilot signals differ for each track. 15-bit serial data outputted from P-S converting unit 8 is recorded in tracks T1-T4 shown in FIG. 14. Pilot signals with frequencies which are different for each track are thus recorded.

When reproducing, a pilot signal recorded in each of respective tracks T1-T4 is reproduced, and a frequency of that pilot signal and a reference signal with the same frequency are multiplied. If the frequency of the pilot signal differs from the frequency of the reference signal, beat occurs corresponding to the difference of frequency. The frequency of the difference is extracted by a bandpass filter or the like and tracking information is obtained.

The digital modulating method of this embodiment can also be applied to tracking control methods with pilot signals of one frequency, two frequencies or other numbers of frequencies, as well as pilot signals of four frequencies.

As described above, according to the present invention, the number of identical bits which are continuous in a 15-bit codeword sequence is not less than 2 and not more than 8, and DSV at a last bit of each 15-bit codeword periodically varies. Accordingly, the density ratio increases and the periodical variation of DSV can be used as a pilot signal. As a result, high density recording is enabled and tracking control is also enabled in which a reproduced signal does not suffer from crosstalk disturbance due to a pilot signal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A digital modulating method for a magnetic medium for converting a 8-bit data word sequence into a 15-bit codeword sequence, comprising the steps of:
    (a) assigning a plurality of 15-bit codewords to each 8-bit data word so that a number of continuous identical bits is not less than 2 and not more than 8 in the 15-bit codeword sequence, and
    (b) selecting one of the plurality of 15-bit codewords assigned to each 8-bit data word so that a digital sum variation of a last bit of each of the plurality of 15-bit codewords periodically changes, wherein said assigning step (a) includes the sub-steps of,
        (a) (1) producing a plurality of first code pairs, each including a 15-bit codeword with a codeword digital sum of $+3$ and a 15-bit codeword with a codeword digital sum of $-1$ and a plurality of second code pairs, each including a 15-bit codeword with a codeword digital sum of $+1$ and a 15-bit codeword with a codeword digital sum of $-3$,
        (a) (2) assigning one of said plurality of first code pairs and one of said plurality of second code pairs to each 8-bit data word, and
        (a) (3) selecting one of the plurality of first code pairs and one of the plurality of second code pairs assigned to each 8-bit data word so that the number of continuous identical bits is not less than 2 and not more than 8 in the 15-bit codeword sequence,
    wherein said selecting sub-step (a) (3) further includes,
        (a) (3) (A) selecting one of the two 15-bit codewords included in the selected code pair so that the digital sum variation of the last bit of each 15-bit codeword periodically varies.

2. The digital modulating method of claim 1, said producing sub-step (a) (1) including the sub-steps of,
    (a) (1) (A) selecting 15-bit codewords as candidates from the plurality of 15-bit codewords, such that
    a number of continuous identical bits is not more than 7 at a beginning portion of any of the plurality of 15-bit codewords,
    the number of continuous identical bits is not more than 7 at an ending portion of any of the plurality of 15-bit codewords,
    the number of continuous identical bits from a second bit to a fourteenth bit of any of the plurality of 15-bit codewords is not less than 2 and not more than 8, and
    an absolute value of a codeword digital sum of any of the plurality of 15-bit codewords is not more than 3,
    (a) (1) (B) sorting the selected 15-bit codewords as candidates into a group including 15-bit codewords beginning with 00, a group including 15-bit codewords beginning with 01, a group including 15-bit codewords beginning with 10, and a group including 15-bit codewords beginning with 11,
    (a) (1) (C) storing the 15-bit codewords included in each group into 15-bit codewords with a codewords digital sum of $+3$, 15-bit codewords with a codeword digital sum of $+1$, 15-bit codewords with a codeword digital sum of $-1$, and 15-bit codewords with a codeword digital sum of $-3$, and
    (a) (1) (D) producing the plurality of first code pairs, each including a 15-bit codeword with a codeword digital sum of $+3$ and a 15-bit codeword with a codeword digital sum of $-1$ and producing the plurality of second code pairs, each including a 15-bit codeword with a codeword digital sum of $+1$ and a 15-bit codeword with a codeword digital sum of $-3$ in each of the groups of 15-bit codewords beginning with 00, 01, 01, 10, and 11.

3. The digital modulating method of claim 2, wherein said selecting step (a) (3) includes the sub-steps of,
    (a) (3) (A) selecting one of the plurality of 15-bit codewords beginning with 11 or 01 when a last two bits of a preceding 15-bit codeword in the 15-bit codeword sequence are 00,
    (a) (3) (B) selecting one of the plurality of 15-bit codewords beginning with 11 or 10 when the last two bits of the preceding 15-bit codeword in the 15-bit codeword sequence are 01,
    (a) (3) (C) selecting one of the plurality of 15-bit codewords beginning with 00 or 01 when the last two bits of the preceding 15-bit codeword in the 15-bit codeword sequence are 10, and
    (a) (3) (D) selecting one of the plurality of 15-bit codewords beginning with 00 or 10 when the last two bits of the preceding 15-bit codeword in the 15-bit codeword sequence are 11.

4. The digital modulating method of claim 1, wherein said selecting step (a) (3) including the sub-steps of,
    (a) (3) (A) determining a control value of digital sum variation of a last bit of each of the plurality of 15-bit codewords and a real value of digital sum variation of the last bit of each of the plurality of 15-bit codewords and
    (a) (3) (B) selecting one of the two 15-bit codewords included in the selected code pair on the basis of said determined digital sum variation control value and the digital sum variation real value, and wherein
    said digital sum variation, control value represents a digital sum variation target value which periodically varies.

5. The digital modulating method of claim 4, wherein said determining step (a) (3) (A) includes the sub-steps of,
    (a) (3) (A) (i) setting a difference between a digital sum variation of a control value of a last bit of a current 15-bit codeword and a digital sum variation of a control value of a last bit of a next 15-bit codeword to one of a plurality predetermined values, and (a) (3) (A) (ii) setting a difference between a digital sum variation real value of the last bit of the current 15-bit codeword and a digital sum variation control value of the last bit of the current 15-bit codeword within a predetermined range.

6. The digital modulating method of claim 5, wherein said selecting step (a) (3) (B) includes the sub-steps of, (a) (3) (B) (i) selecting one of said two 15-bit codewords so that a difference between the digital sum variation real value of the last bit of the current 15-bit codeword and the digital sum variation control value of the last bit of the next 15-bit codeword is within the predetermined range.

7. The digital modulating method of claim 5, wherein said plurality of predetermined values includes $-1$, $0$ and $+1$, and said predetermined range is not less than $-1$ and not more than 2.

8. The digital modulating method of claim 6, wherein said predetermined range is not less than $-2$ and not more than $+3$.

9. A digital modulating apparatus for a magnetic medium for converting a 8-bit data word sequence into a 15-bit codeword sequence, comprising:

control means for generating a control signal for periodically changing a digital sum variation of a last bit of each 15-bit codeword, in the 15-bit codeword sequence, and converting means for sequentially converting each 8-bit data word in the 8-bit data word sequence into a 15-bit codeword so that a number of continuous identical bits is not less than 2 and not more than 8 in the 15-bit codeword sequence, in response to the control signal from said control means, wherein said converting means produces a plurality of first code pairs, each including a 15-bit codeword with a codeword digital sum of $+3$ and a 15-bit codeword with a codeword digital sum of $-1$ and a plurality of second code pairs, each including a 15-bit codeword with a codeword digital sum of $+1$ and a 15-bit codeword with a codeword digital sum of $-3$, assigns one of said plurality of first code pairs and one of said plurality of second code pairs to each 8-bit data word, selects one of the plurality of first code pairs and one of the plurality of second code pairs assigned to each 8-bit data word so that the number of continuous identical bits is not less than 2 and not more than 8 in a 15-bit codeword sequence, and selects one of two 15-bit codewords included in the selected code pair so that the digital sum variation of the last bit of each 15-bit codeword periodically varies.

10. A digital modulating apparatus for a magnetic medium for converting a 8-bit data word sequence into a 15-bit codeword sequence, comprising:

control means for generating a control signal for periodically changing a digital sum variation of a last bit of each 15-bit codeword, in the 15-bit codeword sequence, and converting means for sequentially converting each 8-bit data word in the 8-bit data word sequence into a 15-bit codeword so that a number of continuous identical bits is not less than 2 and not more than 8 in the 15-bit codeword sequence, in response to the control signal from said control means, wherein said control signal represents a difference between a digital sum variation control value of a last bit of a current 15-bit codeword and a digital sum variation control value of a last bit of a next 15-bit codeword, and said digital sum variation control value represents a digital sum variation target value which periodically changes, and said converting means converts each 8-bit data word into a 15-bit codeword on the basis of the difference between the digital sum variation control value of the last bit of the current 15-bit codeword and the digital sum variation control value of the last bit of the next 15-bit codeword and a digital sum variation real value of the last bit of the current 15-bit codeword.

11. The digital modulating apparatus of claim 10, wherein said converting means comprises:

first adding means;

first holding means for holding an output of said first adding means;

second adding means;

signal generating means for generating a selection signal in response to an output of said second adding means;

8-15 converting means;

output means for outputting a difference between a digital sum variation real value of the last bit of the next 15-bit codeword and the digital sum variation real value of the last bit of the current 15-bit codeword; and second holding means for holding a last two bits of a 15-bit codeword, wherein said first adding means adds an output of said control means, an output of said first holding means, and an output of said output means, said second adding means adds an output of said control means and an output of said first holding means, and said 8-15 converting means selects and outputs one of 15-bit codewords on the basis of an inputted 8-bit data word, said selection signal, and an output of said second holding means.

12. The digital modulating apparatus according to claim 11, wherein said signal generating means generates a first selection signal when an output of said second adding means is a first value, generates a second selection signal when an output of said second adding means is a second value, and generates a third selection signal when an output of said second adding means is a third value, and said 8-15 converting means selects a 15-bit codeword with a codeword digital sum of $-1$ or $-3$ in response to said first selection signal, selects a 15-bit codeword with a codeword digital sum of $+1$ or $-1$ in response to said second selection signal, and selects a 15-bit codeword with a codeword digital sum of $+3$ or $+1$ in response to said third selection signal.

13. The digital modulating apparatus of claim 11, further comprising parallel/serial converting means for converting the 15-bit codeword outputted from said 8-15 converting means into 15-bit serial modulated signal.

14. A digital modulating method for a magnetic medium for converting a 8-bit data word sequence into a 15-bit codeword sequence, comprising the steps of:

(a) assigning a plurality of 15-bit codewords to each 8-bit data word so that a number of continuous identical bits is not less than 2 and not more than 8 in the 15-bit codeword sequence, and (b) selecting one of the plurality of 15-bit codewords assigned to each 8-bit data word so that a digital sum variation of a last bit of each of the plurality of 15-bit codewords periodically changes, wherein the magnetic medium includes a plurality of tracks, and a density ratio on the magnetic medium is greater than 1.0.

15. The digital modulating method of claim 14, wherein a minimum length between transitions, $Tmin = 1.07\ T_b$ and a maximum length between transition $Tmax = 4.27\ T_b$, where $T_b$ equals a bit interval of the 8-bit data word sequence.

16. A digital modulating apparatus for a magnetic medium for converting a 8-bit data word sequence into a 15-bit codeword sequence, comprising:

control means for generating a control signal for periodically changing a digital sum variation of a last bit of each 15-bit codeword, in the 15-bit codeword sequence, and converting means for sequentially converting each 8-bit data word in the 8-bit data word sequence into a 15-bit codeword so that a number of continuous identical bits is not less than 2 and not more than 8 in the 15-bit codeword sequence, in response to the control signal from said control means, wherein the magnetic medium includes a plurality of tracks, and, a density ratio on the magnetic medium is greater than 1.0.

17. The digital magnetic apparatus of claim 16, wherein a minimum length between transitions $Tmin = 1.07\ T_b$ and a maximum length between transition $Tmax = 4.27\ T_b$, where $T_b$ equals a bit interval of the 8-bit data word sequence.

* * * * *